US009054676B2

(12) United States Patent
Vickes et al.

(10) Patent No.: US 9,054,676 B2
(45) Date of Patent: Jun. 9, 2015

(54) ACTIVE CIRCULATOR

(75) Inventors: Hans-Olof Vickes, Särö (SE); Joakim Nilsson, Mölndal (SE)

(73) Assignee: SAAB AB, Linköping (SE)

( * ) Notice: Subject to any disclaimer, the term of this patent is extended or adjusted under 35 U.S.C. 154(b) by 269 days.

(21) Appl. No.: 13/805,032

(22) PCT Filed: Jun. 18, 2010

(86) PCT No.: PCT/SE2010/050695
§ 371 (c)(1),
(2), (4) Date: Feb. 27, 2013

(87) PCT Pub. No.: WO2011/159213
PCT Pub. Date: Dec. 22, 2011

(65) Prior Publication Data
US 2013/0169367 A1 Jul. 4, 2013

(51) Int. Cl.
H01P 1/32 (2006.01)
H03H 11/36 (2006.01)
H03F 3/60 (2006.01)

(52) U.S. Cl.
CPC ............. *H03H 11/362* (2013.01); *H03F 3/604* (2013.01); *H03F 3/607* (2013.01)

(58) Field of Classification Search
USPC .................... 333/1.1, 100; 455/78, 79, 82, 83
See application file for complete search history.

(56) References Cited

U.S. PATENT DOCUMENTS 5,081,706 A 1/1992 Kim
7,129,783 B2 * 10/2006 Young et al. ............... 330/286
7,541,890 B2 * 6/2009 Cheung et al. .............. 333/117
2004/0192392 A1 * 9/2004 Hoppenstein et al. ...... 455/562.1
2009/0108954 A1 4/2009 Cheung et al.

(Continued)

FOREIGN PATENT DOCUMENTS

EP 2159922 A1 3/2010
FR 2895150 A1 6/2007
WO WO-02/41442 A1 5/2002

OTHER PUBLICATIONS

Leisten O P et al; "Distributed Amplifiers as Duplexer/Circulator Components at S-Band", IEE Colloquium on Solid State Components for Radar, Feb. 12, 1988, pp. 5/1-5/4.

(Continued)

*Primary Examiner* — William Hernandez
(74) *Attorney, Agent, or Firm* — Venable LLP; Eric J. Franklin

(57) ABSTRACT

An active circulator for a microwave system. The microwave system includes at least one front-end arrangement. Each front-end arrangement includes a power amplifier function arranged to deliver an amplified output signal via a circulator function to an antenna in a transmit mode. A low noise amplifier function is arranged to amplify an input signal from the antenna via the circulator function in a receive mode. The circulator function is arranged to direct a signal flow between the transmit and receive modes. Each front-end arrangement includes one active circulator. The active circulator includes the power amplifier function, the low noise amplifier function and the circulator function of directing a signal flow. The functions integrated into one module. Also, a method to manufacture the active circulator.

11 Claims, 5 Drawing Sheets

(56) References Cited

U.S. PATENT DOCUMENTS

2009/0286492 A1 11/2009 Mallet-Guy et al.
2010/0052814 A1 3/2010 Plaze et al.

OTHER PUBLICATIONS

M.J. Schindler et al.; "A Single Chip 2-20 GHz T7R Module", IEEE 1990 Microwave and Millimeter-Wave Monolithic Circuits Symposium, pp. 99-102.
Shaoyong Zheng et al., "Distributed Power Amplifier/Feedback Low Noise Amplifier Switch-Less Front-End", Microwave and Optical Technical Letters; vol. 48, No. 8, Aug. 2006, pp. 1659-1662.
PCT/ISA/210—International Search Report—Jan. 27, 2011 (Issued in PCT/SE2010/050695).
PCT/ISA/237—Written Opinion of the International Search Authority—Jan. 27, 2011 (Issued in PCT/SE2010/050695).
PCT/IPEA/409—International Preliminary Report on Patentability—Oct. 16, 2012 (Issued in PCT/SE2010/050695).
PCT/IPEA/408—Written Opinion of the International Preliminary Examining Authority—Sep. 14, 2012 (Issued in PCT/SE2010/050695).
European Search Report—Oct. 7, 2013 (Issued in Counterpart Application No. 10853324.1).

* cited by examiner

ACTIVE CIRCULATOR

CROSS-REFERENCE TO RELATED APPLICATIONS

This application is the national phase under 35 U.S.C. §371 of PCT/SE2010/050695 filed 18 Jun. 2010.

TECHNICAL FIELD

The present invention relates to the field of circulators in microwave systems such as Active Electronically Scanned Antenna (AESA) systems.

BACKGROUND

A circulator is in general a three-port device finding its place in all microwave systems, e.g. in AESA-systems and their associated Transmit/Receive-modules (T/R-modules) with the function to direct a signal flow from a transmitter to the antenna or to direct a signal flow from the antenna to the receiver. This is sometimes also described as switching between transmit and receive modes. The circulator can also have an additional function to work as a matching device between poorly matched functional blocks, e.g. as a matching device between the antenna and the transmitter or receiver. The circulator is located at the end of the T/R-module, close to the antenna. In addition to the circulator component there are also separate components as the power amplifier, PA, for the transmitted signal and the low noise amplifier, LNA, for the received signal. All these three components, often called a front-end arrangement of the T/R module, require a substantial area on a circuit bord.

By tradition the circulator itself is a design, based on ferrite disks and a bias magnet. This building practice result in a large occupying area with special mounting requirements. In addition it attenuates RF signals. Ferrite based circulators are also narrowband components occupying a large building area (Area=250–400 $mm^2$). Together with the PA and LNA components, the area of this solution for a front-end arrangement is large. When the term RF-signal is used it includes all types of microwave signals.

FIG. 1 shows a conventions front-end arrangement with a Power Amplifier, PA 101, connected to a first port 102 of a circulator 103. A second port 104 of the circulator is connected via a limiter 105 to a Low Noise Amplifier, LNA, 106. A third port 107 of the circulator is connected to an antenna 108. The circulator is thus a three port device connecting the PA to the antenna when the antenna is working in the transmit mode and connecting the antenna, via the limiter, to the LNA when the antenna is operating in the receive mode. The limiter is protecting the LNA from high amplitudes of receievd energy.

US 2009/0286492 A1 presents a solution where the circulator is replaced by a semiconductor switch using Gallium Nitride (GaN) transistors. This solution however requires a separate component for the switch and at least one component for the LNA and PA, thus taking up a large building area.

There is thus a need for a solution providing a front-end arrangement for T/R-modules with at least reduced size and weight.

SUMMARY

The object of the invention is to reduce at least some of the mentioned deficiencies with prior art solutions and to provide:
  an active circulator for a microwave system and
  a method to manufacture an active circulator for a microwave system
to solve the problem to achieve a front-end arrangement for T/R-modules with reduced size and weight.

The object is achieved by providing an active circulator for a microwave system. Said microwave system comprises at least one front-end arrangement. Each front-end arrangement comprises a power amplifier function arranged to deliver an amplified output signal via a circulator function to an antenna in a transmit mode. A low noise amplifier function is arranged to amplify an input signal from the antenna via the circulator function in a receive mode. The circulator function is arranged to direct a signal flow between the transmit and receive modes wherein each front-end arrangement comprises one active circulator. Said active circulator comprises the power amplifier function, the low noise amplifier function and the circulator function of directing a signal flow, said three functions integrated into one module.

The object is further achieved by providing a method to manufacture an active circulator for a microwave system. Said microwave system using at least one front-end arrangement. Each front-end arrangement has a power amplifier function arranged to deliver an amplified output signal via a circulator function to an antenna in a transmit mode. A low noise amplifier function is arranged to amplify an input signal from the antenna via the circulator function in a receive mode. The circulator function is arranged to direct a signal flow between the transmit and receive modes wherein the active circulator is manufactured as one module with the power amplifier function, the low noise amplifier function and the circulator function of directing a signal flow, said three functions for one front-end arrangement thus being integrated into one module.

In one example of the active circulator of the invention the power amplifier function and the low noise amplifier function of the active circulator are arranged as a Distributed Power Amplifier, DPA, and as a Distributed Low Noise Amplifier, DLNA, thus achieving a broad band performance. A distributed amplifier comprises at least two amplifiers connected in parallel between two transmission lines, one transmission line comprising an input port to the distributed amplifier and the other transmission line comprising an output port of the distributed amplifier.

By arranging the amplifier functions as distributed amplifiers, a distributed amplification of the RE-signal is accomplished. The distributed amplification principle has the advantage of inherently being very broad band and the possibility of a bandwidth of at least one decade can be achieved with a substantially constant gain over the bandwidth. A typical example of the invention can have a bandwidth of 3-40 GHz but also broader bandwidths are possible. With this configuration of the amplifier function, portions of the RF-signal are successively tapped from the transmission line comprising the input port of the amplifier function to the transmission line comprising the output port of the amplifier function. The principle of the distributed amplification can however also be applied to amplifier functions of the invention in applications where a bandwidth less than one decade is sufficient.

In one example of the active circulator of the invention, the active circulator is a Monolithic Microwave Integrated Circuit, MMIC, module.

In one example of the active circulator of the invention the MMIC module is based on Gallium Nitride, GaN, semiconductor technology.

In one example of the method to manufacture an active circulator for a microwave system the active circulator is manufactured as a Monolithic Microwave Integrated Circuit, MMIC, module.

In one example of the method to manufacture an active circulator for a microwave system the MMIC module is manufactured using Gallium Nitride, GaN, semiconductor technology.

Further advantages are further described below

DETAILED DESCRIPTION

The invention will now be described with reference to the enclosed drawings.

Figure 1:
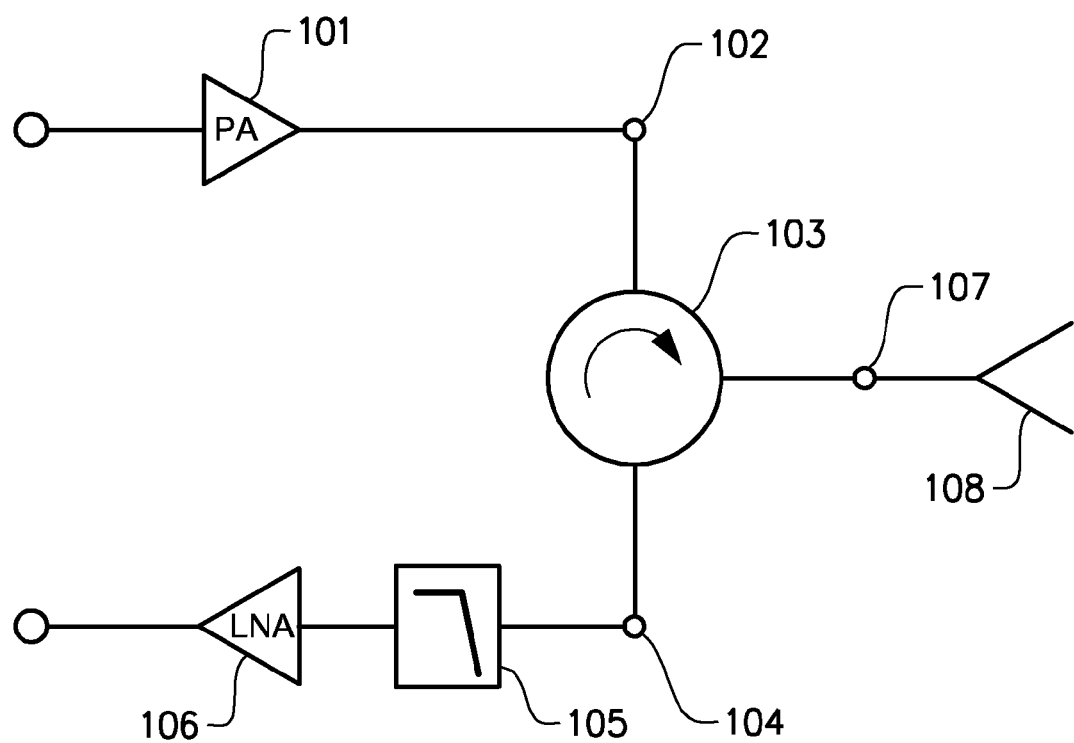
FIG. 1 schematically shows a prior art front-end arrangement.

FIG. 1 has already been described in the background part.

The active circulator of the invention can e.g. be used as a front-end arrangement in a microwave system said microwave system comprising at least one front-end arrangement. Each front-end arrangement comprises a power amplifier function arranged to deliver an amplified output signal via a circulator function to an antenna in a transmit mode, and a low noise amplifier function arranged to amplify an input signal from the antenna via the circulator function in a receive mode. The circulator function is arranged to direct a signal flow between the transmit and receive modes, wherein each front-end arrangement comprises one active circulator, said active circulator comprises the power amplifier function, the low noise amplifier function and the circulator function of directing a signal flow, said three functions integrated into one module.

An example of an active circulator 201 shall now be described in detail with reference to FIG. 2. The active circulator comprises an output transmission line 202, an antenna transmission line 203 and an input transmission line 204 arranged in parallel, with the antenna transmission line located between the output transmission line and the input transmission line. The transmission lines have two ends, a first end and second end, and are arranged to extend between a first side 205 and a second side 206 of the active circulator with their first ends located at the first side and the second ends at the second side of the active circulator.

The output transmission line 202 comprises a transmit input port TXin connected to the first end at the first side 205 and a first termination impedance 207 connected to the second end at the second side 206. The antenna transmission line 203 comprises a second termination impedance 208 connected to the first end at the first side 205 and an antenna port ANT connected to the second end at the second side 206. An antenna 210 suitable for the application is connected to the antenna port. The active circulator of the invention can be applied to any type of antenna suitable for the intended application. The antenna port also serves as an RXin port, i.e. it receives an input signal from the antenna and as a TXout port, i.e. it connects a signal from the power amplifier function to the antenna.

The input transmission line 204 comprises a receive output port RXout connected to the first end at the first side 205 and a third termination impedance 209 connected to the second end at the second side 206.

The power amplifier function and the low noise amplifier function of the active circulator are preferably arranged as a Distributed Power Amplifier (DPA) and as a Distributed Low Noise Amplifier (DLNA) thus achieving a broad band performance as described in the Summary part above. A distributed amplifier comprises at least two amplifiers $A_{t,1}$ to $A_{t,m}$, $A_{r,1}$ to $A_{r,m}$, connected in parallel between two transmission lines, one transmission fine comprising an input port to the distributed amplifier and the other transmission line comprising an output port of the distributed amplifier. In the example of FIG. 2 the Distributed Power Amplifier (DPA) comprises at least two transmit amplifiers $A_{t,i}$ connected in parallel between the output transmission line 202 and the antenna transmission line 203 and the Distributed Low Noise Amplifier (DLNA) comprises at least two receive amplifiers $A_{r,i}$ connected in parallel between the antenna transmission line and the input transmission line. The index i being an integer raising index ranging from 1 to m.

The termination impedances are connected to a common reference plane such as a ground plane. The termination impedances have the function of tuning both the DPA and the DLNA for most efficient signal flow (flat gain over bandwidth). The associated resistance values for the termination impedances are usually in the range of 20-80 ohms, but this is merely a typical example, not limiting the scope of the invention.

Each transmission line is divided in transmission line sections $T_{t,1}$ to $T_{t,m+1}$, $T_{a,1}$ to $T_{a,m+1}$ and $T_{r,1}$ to $T_{r,m+1}$ for the output transmission line, the antenna transmission line and the receive transmission line respectively. The numbering, denoted with the second index running from 1 to m+1, of the transmission line sections starts from the first side of the active circulator.

The amplifiers have an input terminal and an output terminal. Each point between two transmission line sections of the output transmission line, here defined as a first starting point, is connected to the input terminal of one transmit amplifier via a first input matching line section 210 and the output terminal of this transmit amplifier is connected, via a first output matching line section 211, to a point, here defined as a first end point, between two transmission line sections of the antenna transmission line having the same second index numbers as the two transmission line sections surrounding the first starting point.

Each point between two transmission line sections of the antenna transmission line, here defined as a second starting point, is connected to the input terminal of one receive amplifier via a second input matching line section 212 and the output terminal of this receive amplifier is connected, via a second output matching line section 213, to a point, here defined as a second end point, between two transmission line sections of the input transmission line having the same second index numbers as the two transmission line sections surrounding the second starting point. In this case the first end point is the same point as the second starting point. The transmit and receive amplifiers are thus arranged in a matrix having m columns and two rows, a transmit row and a receive row.

Each transmission line section has a certain length and width which affects the impedance and time delay of each transmission line section. For practical reasons the length of the transmission line sections are normally the same and the impedance is changed by varying the width of the transmission line sections. The matching line sections can be varied in the same way as the transmission line sections in order to match the amplifiers to the transmission lines. The impedance values of the transmission line sections and the matching line sections are usually higher than 50 ohms, typically in the range of 50-90 ohms, but this is merely a typical example, not limiting the scope of the invention.

The active circulator thus has three ports:
- an antenna port ANT for connection to the antenna, this port being a common port for the output signal from the power amplifier function TXout and for the input signal from the antenna RXin,
- a transmit in port TXin arranged to receive an input signal to the power amplifier function and
- a receive out port RXout arranged to output a signal from the low noise amplifier function.

The theory of operation in transmit mode can then be explained as follows with reference to the example of FIG. 2. The power amplifier, PA, has an input RF-port, TXin, and an output RF-port, TXout. An incoming wave at the TXin port travels in the direction towards the TXout port along the output transmission line 202 of impedance, Za, is successively tapped and amplified at three locations through the transmit amplifiers and fed to the antenna transmission line of impedance, Zb, where the amplified portions of the incoming wave travels towards the TXout port and adds up as an output signal entering the output port, TXout. This circuit arrangement is, as mentioned above, called a distributed amplifier, in this case a distributed power amplifier, DPA. In transmit mode, the circuit arrangement in the upper part (with the receive amplifiers), is turned off by using a control voltage, as will be further explained.

The theory of operation in receive mode can then be explained as follows with reference to the example of FIG. 2. The low noise amplifier, LNA, has an input RF-port, RXin, and an output RF-port, RXout. An incoming wave at the RXin port travels in the direction towards the RXout port along the antenna transmission line of impedance, Zb, is successively tapped and amplified at three locations through the receive amplifiers and fed to the input transmission line of impedance, Zc, where the amplified portions of the incoming wave travels towards the RXout port and adds up as an output signal entering the output port, RXout. This circuit arrangement is called a distributed amplifier, in this case a distributed low noise amplifier, DLNA. In receive mode, the circuit arrangement in the lower part (with the transmit amplifiers), is turned off by using a control voltage, as will be explained.

The two RF-port notations, $RX_{in}$ and $TX_{out}$, are actually the same physical port as the antenna port, ANT. The different notations are just used to illustrate the two modes of operation, receive and transmit.

The proposed circuit arrangement can be implemented in several ways. Depending on the semiconductor technology used in the implementation, different characteristics can be obtained. In using a GaAs semiconductor technology, a substantial bandwidth of both the power amplifier function and the low noise amplifier function would be achieved.

With the GaN semiconductor technology it is possible to achieve, over and above a broad bandwidth, also a higher output power, as this technology typically produces a power density, referring to transistor size, of around 5-6W/mm. In addition, this semiconductor technology has an inherent property of very high breakdown voltages. This property has resulted in circuits, e.g. robust low noise amplifiers, that can withstand very high voltage swings at transistor level and that can be used in distributed low noise amplifiers. This makes a separate receiver limiter circuit redundant. Hence, the most relevant semiconductor technology is gallium nitride (GaN) and its application in Transmit/Receive-modules, T/R-modules. The frequency band of main interest for the invention is 2-18 GHz. The principle of the invention is however not limited to the use of the described semiconductor technology and the exemplified frequency range, but also other suitable semiconductor technologies can be used and the invention can be adapted also to other frequency ranges.

An advantage of the invention is that in one Monolithic Microwave Integrated Circuit, MMIC, module, based on e.g. GaN semiconductor technology it is possible to integrate the low noise amplifier (LNA), the power amplifier (PA) and the circulator function of directing a signal flow between transmit mode (TX) and receive mode (RX), with good isolation over a large bandwidth. The semiconductor area of the active circulator can in one example of the invention be around 25 times smaller in comparison with the design approach using ferrite based circulators and separate designs of PA and LNA.

Figure 3:
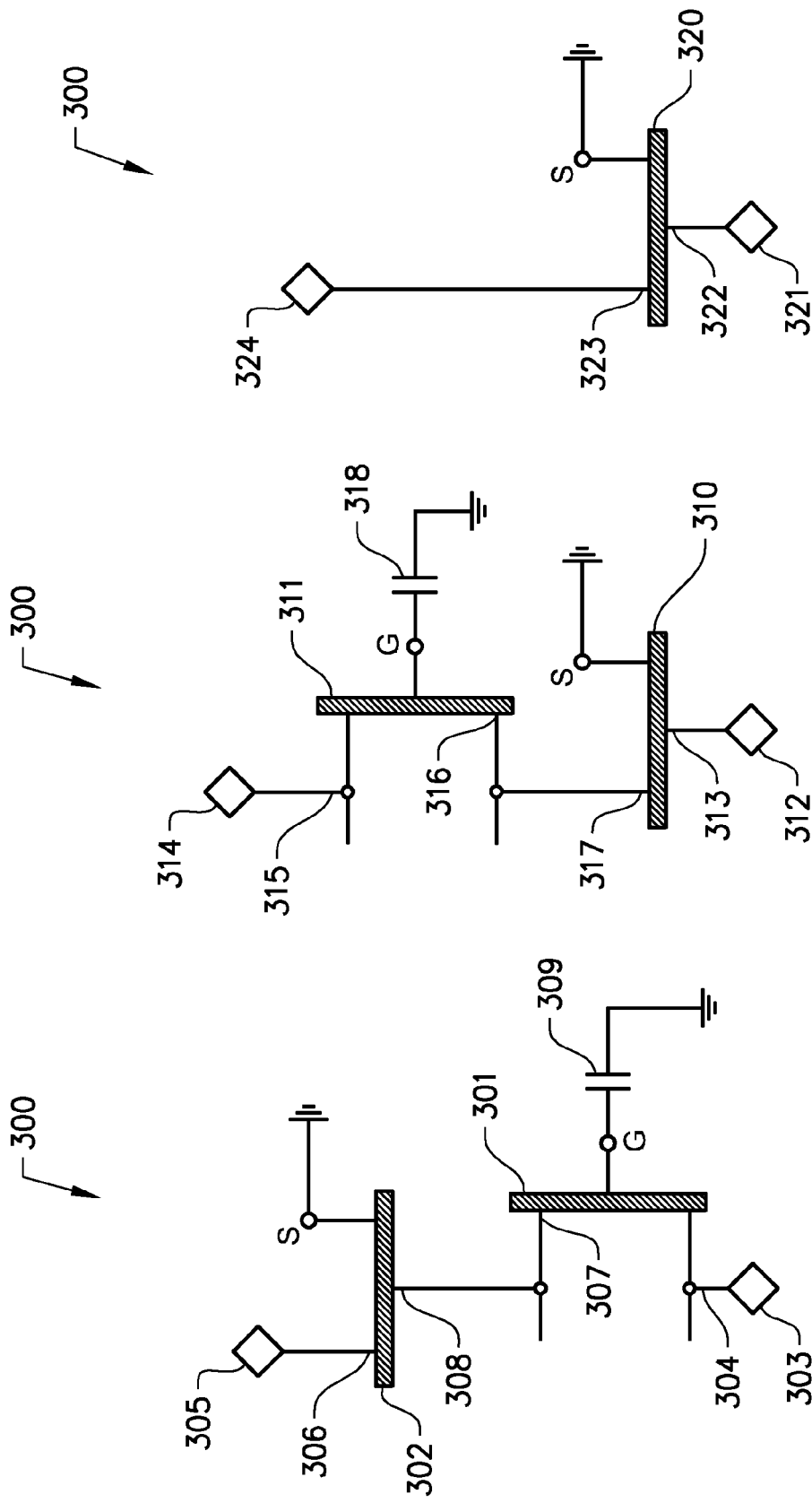
FIG. 3 schematically shows examples of amplifiers used in the active circulator.

The amplifier functions of the active circulator, receive and transmit amplifiers, can be accomplished by any conventional means suitable for integration into a module such as e.g. a Monolithic Microwave Integrated Circuit, MMIC, module. FIG. 3 schematically shows some suitable amplifier realizations of amplifiers 300. In FIG. 3a the amplifier 300 comprises a first transistor 301 and a second transistor 302 connected in a well known common gate/common source combination where the gate, G, of the first transistor and the source, S, of the second transistor is connected to a reference plane such as ground. The input terminal 303 of the amplifier is connected to the source 304 of the first transistor. The output terminal 305 of the amplifier is connected to the drain terminal 306 of the second transistor. The gate terminal 308 of the second transistor is connected to the drain terminal 307 of the first transistor. A first capacitor 309 is inserted between the gate terminal of the first transistor and the ground, making current control possible.

In FIG. 3b the amplifier 300 comprises a third transistor 310 and a fourth transistor 311 connected in a well known common source/common gate combination where the gate, G, of the fourth transistor and the source, S, of the third transistor is connected to a reference plane such as ground. The input terminal 312 of the amplifier is connected to the gate 313 of the third transistor. The output terminal 314 of the amplifier is connected to the drain terminal 315 of the fourth transistor. The source terminal 316 of the fourth transistor is connected to the drain terminal 317 of the third transistor. A second capacitor 318 is inserted between the gate terminal of the fourth transistor and the ground, making current control possible.

The amplifier function accomplished in the realizations according to FIGS. 3a and 3b are advantageous from an isolation point of view as it improves the isolation between transmit and receive function. This is due to the fact that two transistors are used to realize the amplifier function, having the effect of a "double isolation" between the transmission lines when the DPA or DLNA is turned off.

FIG. 3c shows a common source, single transistor solution with a fifth transistor 320 having the source, S, connected to a reference plane such as ground. The input terminal 321 of the amplifier is connected to the gate 322 of the fifth transistor and the drain 323 is connected to the output terminal 324 of the amplifier.

The circulator function of directing a signal flow is arranged with the Distributed Low Noise Amplifier, DLNA, being arranged to be turned off while the antenna is working in the transmit mode by a first control voltage being arranged to be connected to the Distributed Low Noise Amplifier, DLNA, and the Distributed Power Amplifier, DPA, is arranged to be turned off while the antenna is working in the receive mode by a second control voltage being arranged to be connected to the Distributed Power Amplifier (DPA). The first control voltage for turning off the DLNA can be applied to the gate terminals of the amplifiers belonging to the DLNA. The second control voltage for turning off the DPA can be applied to the gate terminals of the amplifiers belonging to the DPA. Other solutions for turning off the DLNA or DPA are also possible within the scope of the invention.

The active circulator can preferably be a Monolithic Microwave Integrated Circuit, MMIC, module. The MMIC module is preferably based on Gallium Nitride, GaN, semiconductor technology.

Figure 4:
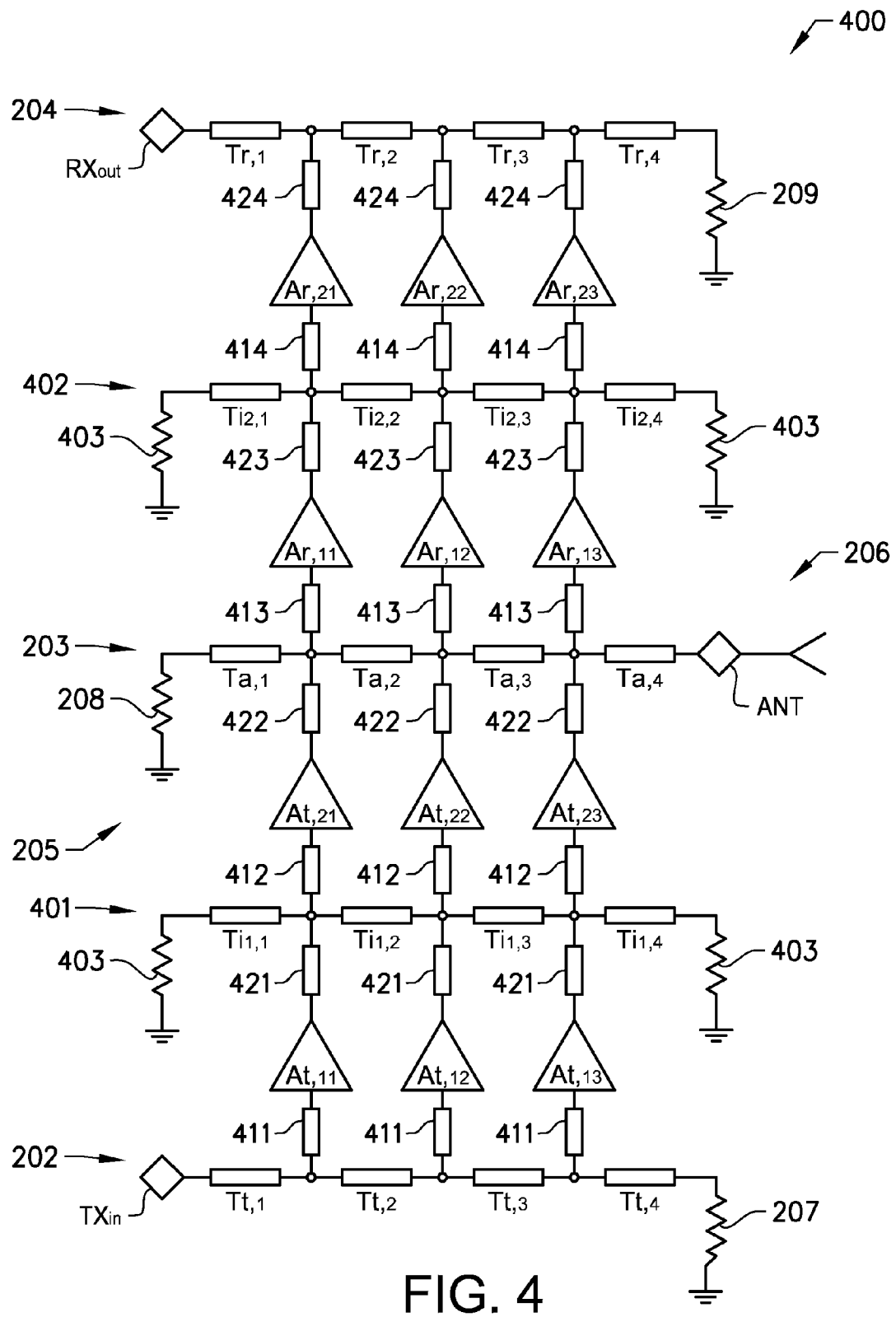
FIG. 4 schematically shows an example of an amplifier with two layers of sub amplifiers used in the active circulator.

In a further example of the invention the amplifiers, the transmit and/or receive amplifiers, comprise at least two layers of sub amplifiers, the sub amplifiers being arranged between two transmission lines where at least one is an intermediate transmission line. FIG. 4 shows the active circulator 400 with the output transmission line 202, the antenna transmission line 203 and the input transmission line 204 as described in association with FIG. 2. In the example of FIG. 4 both the transmit and the receive amplifiers comprises two layers of sub amplifiers. A first intermediate transmission line 401 is inserted in parallel between the output and antenna transmission lines. A second intermediate transmission line 402 is inserted in parallel between the antenna and input transmission lines. The intermediate transmission lines have transmission line sections arranged in the same configuration as the output-, antenna- and input transmission lines with the difference that the intermediate transmission lines are equipped with termination impedances 403 at both the first 205 and second 206 side of the active circulator. The first intermediate transmission line has transmission line sections $T_{i1,1}$ to $T_{i1,4}$ and the second intermediate transmission line has transmission line sections $T_{i2,1}$ to $T_{i2,4}$.

The transmit amplifiers are in this example replaced with two layers of transmit sub amplifiers, each layer having m transmit sub amplifiers. The receive amplifiers are correspondingly replaced with two layers of receive sub amplifiers, each layer having m receive sub amplifiers. The transmit sub amplifiers are denoted At,ij and the receive sub amplifiers Ar,ij where i is an integer running from 1 to n, denoting the layer and j is an integer index running from 1 to m. In the example of FIGS. 4, n=4 and m=3. The transmit sub amplifiers are in layer 1 and 2 and the receive sub amplifiers in layer 3 and 4. The sub amplifiers are thus arranged in a matrix having m columns and n rows.

The $A_{t,1}$ amplifier is, in the example of FIG. 4, replaced with two transmit sub amplifiers $A_{t,11}$ and $A_{t,21}$, with their input and output matching line sections, connected in series. $A_{t,11}/A_{t,21}$ is extending between the output transmission line and the antenna transmission in the same way as $A_{t,1}$. The sub amplifiers have matching line sections connected to both its input and output terminals in the same way as the transmit and the receive amplifiers.

The input matching line sections of the first layer are denoted 411, of the second layer 412, of the third layer 413 and of the fourth layer 414. The output matching line sections of the first layer are denoted 421, of the second layer 422, of the third layer 423 and of the fourth layer 424. $A_{t,11}$ with its matching line sections is connected between the output transmission line and the first intermediate transmission line. Each point, called intermediate points, between transmission line sections in the first intermediate transmission line is connected to a point between the first output matching line section 421 and the second input matching line section 412 in the m columns of sub amplifiers. There are thus m intermediate points in each intermediate transmission line. The $A_{t,21}$ sub amplifier with its matching line sections is connected between a first intermediate point and the antenna transmission line such that the combination $A_{t,11}/A_{t,21}$ is extending between the output transmission line and the antenna transmission in the same way as $A_{t,1}$. The other columns of sub amplifiers, $A_{t,12}/A_{t,22}$ and $A_{t,13}/A_{t,23}$ with their matching line sections are connected between the output transmission line and the antenna transmission line in the same manner.

The intermediate points are numbered in consecutive order, starting with the first intermediate point closest to the first side of the active circulator.

The receive sub amplifiers are inserted between the antenna transmission line and the input transmission line in the same way as the transmit sub amplifiers are inserted between the output transmission line and the antenna transmission line. The $A_{r,1}$ amplifier is, as an example, replaced with two receive sub amplifiers $A_{r,11}$ and $A_{r,21}$ with their matching line sections connected in series. $A_{r,11}/A_{r,21}$ is thus extending between the antenna transmission line and the input transmission in the same way as $A_{r,1}$.

In the configuration of the active circulator according to FIG. 4, the DPA thus comprises two layers of transmit sub amplifiers and the DLNA comprises two layers of receive sub amplifiers. The turning off of the DLNA during transmit mode can be arranged by the first control voltage being applied, or arranged to be connected, to at least one gate terminal in each column of receive sub amplifiers. Preferably the first control voltage is applied, or arranged to be connected, to all gate terminals in each column of receive sub amplifiers. The turning off of the DPA during receive mode can be arranged by the second control voltage being applied, or arranged to be connected, to at least one gate terminal in each column of transmit sub amplifiers. Preferably the second control voltage is applied, or arranged to be connected, to all gate terminals in each column of transmit sub amplifiers.

The first and second control voltages can be generated, or arranged to be generated, by any conventional means within the microwave system or externally. The first control voltage is generated, or arranged to be generated, when the T/R-module is in the transmit mode and the second control voltage is generated, or arranged to be generated, when the T/R-module is in the receive mode.

In the example of FIG. 4 the number of layers of transmit and receive sub amplifiers are the same, in this case two layers of transmit sub amplifiers and two layers of receive sub amplifiers. In other examples of the invention the number of layers for transmit sub amplifiers and receive sub amplifiers can differ. It is also possible to have one layer of transmit amplifiers combined with two layers of receive sub amplifiers, i.e. there are three rows of amplifiers/sub amplifiers.

In further examples of the invention there can also be more than two layers of transmit sub amplifiers and/or more than two layers of receive sub amplifiers. In these applications additional intermediate transmission lines have to be inserted according to the principles described above. In an example of the invention with three layers of transmit sub amplifiers, one layer of transmit sub amplifiers are thus extending between two intermediate transmission lines.

In a further variation of the invention it is possible to have a different number of columns of amplifiers or sub amplifiers for transmit amplifiers and receive amplifiers. As an example it is possible within the scope of the invention to have three columns of transmit amplifiers combined with 5 columns of receive sub amplifiers arranged in two layers.

Figure 5:
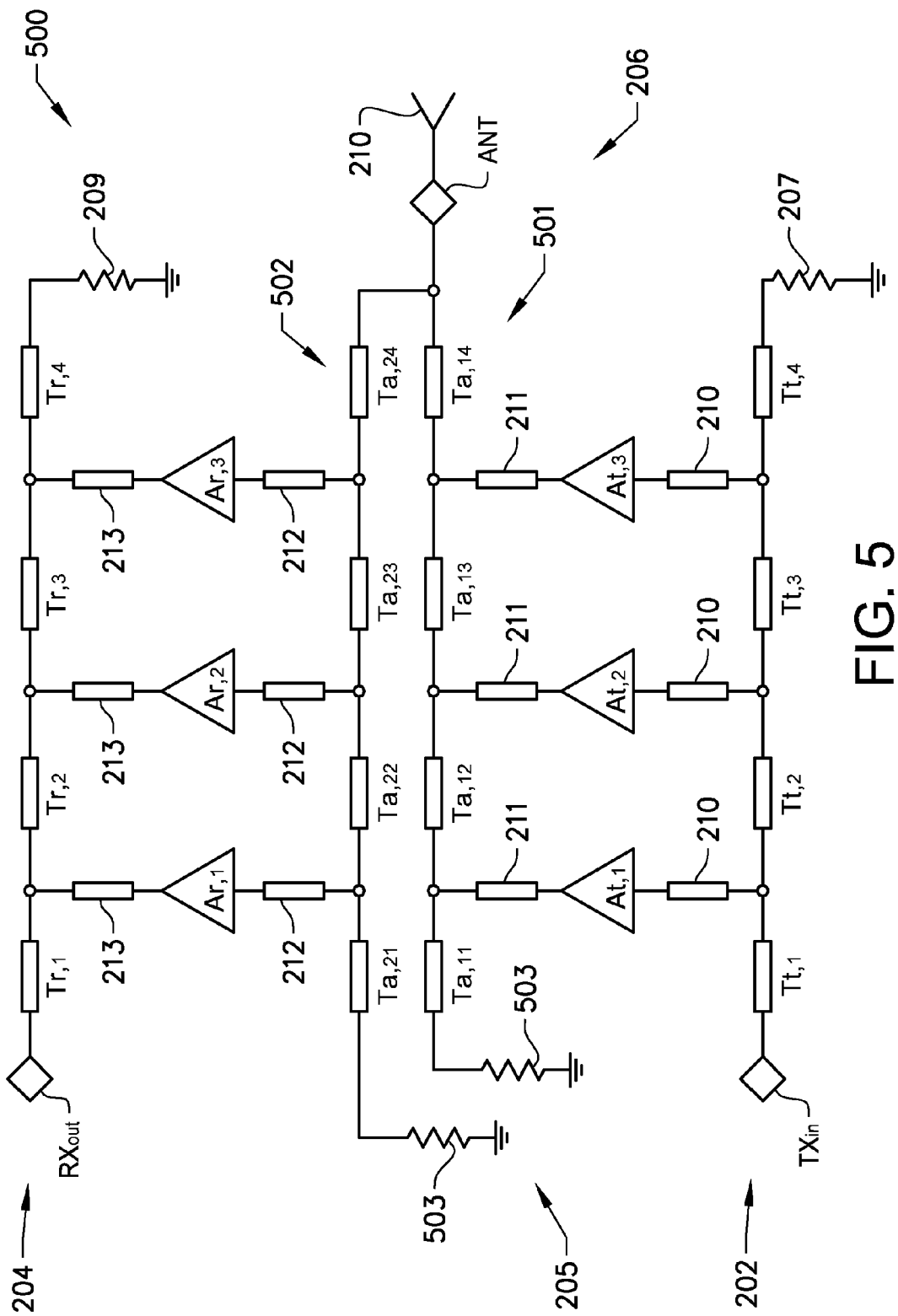
FIG. 5 schematically shows an example of a realization of an antenna transmission line.

In an example of the invention illustrated in FIG. 5, showing the active circulator 500, the antenna transmission line can be divided in two parallel transmission lines, a first 501 and a second 502 antenna transmission line. One end of the antenna transmission lines is connected to the antenna port, ANT, at the second side 206 of the active circulator and the opposite ends of the antenna transmission lines are connected to a reference plane via individual termination impedances 503 or via one common termination impedance (not shown in FIG. 5). The reference plane can e.g. be a ground plane. The example of FIG. 5 has otherwise the same configuration as shown in FIG. 2, i.e. it has three columns, m=3, of amplifiers and one row of transmit amplifiers and one row of receive amplifiers. The first antenna transmission line 501 has m+1, i.e. four transmission line sections Ta,11 to Ta,14. The output signals from the transmit amplifiers are now fed to the first antenna transmission line and travels along the first antenna transmission line to the antenna port as described earlier.

The second antenna transmission line 502 has also m+1, i.e. four transmission line sections Ta,21 to Ta,24. The input signal from the antenna is now fed to the second antenna transmission line and is successively tapped, via the receive amplifiers, to the input transmission line where it travels along the input transmission line to the RXout port as described earlier.

The split of the antenna transmission line into two parallel transmission lines can be applied to all examples and variations of the invention. An advantage with this example of the invention is that the variations of the invention with different numbers of columns for the transmit and receive amplifiers can be more conveniently implemented.

Figure 2:
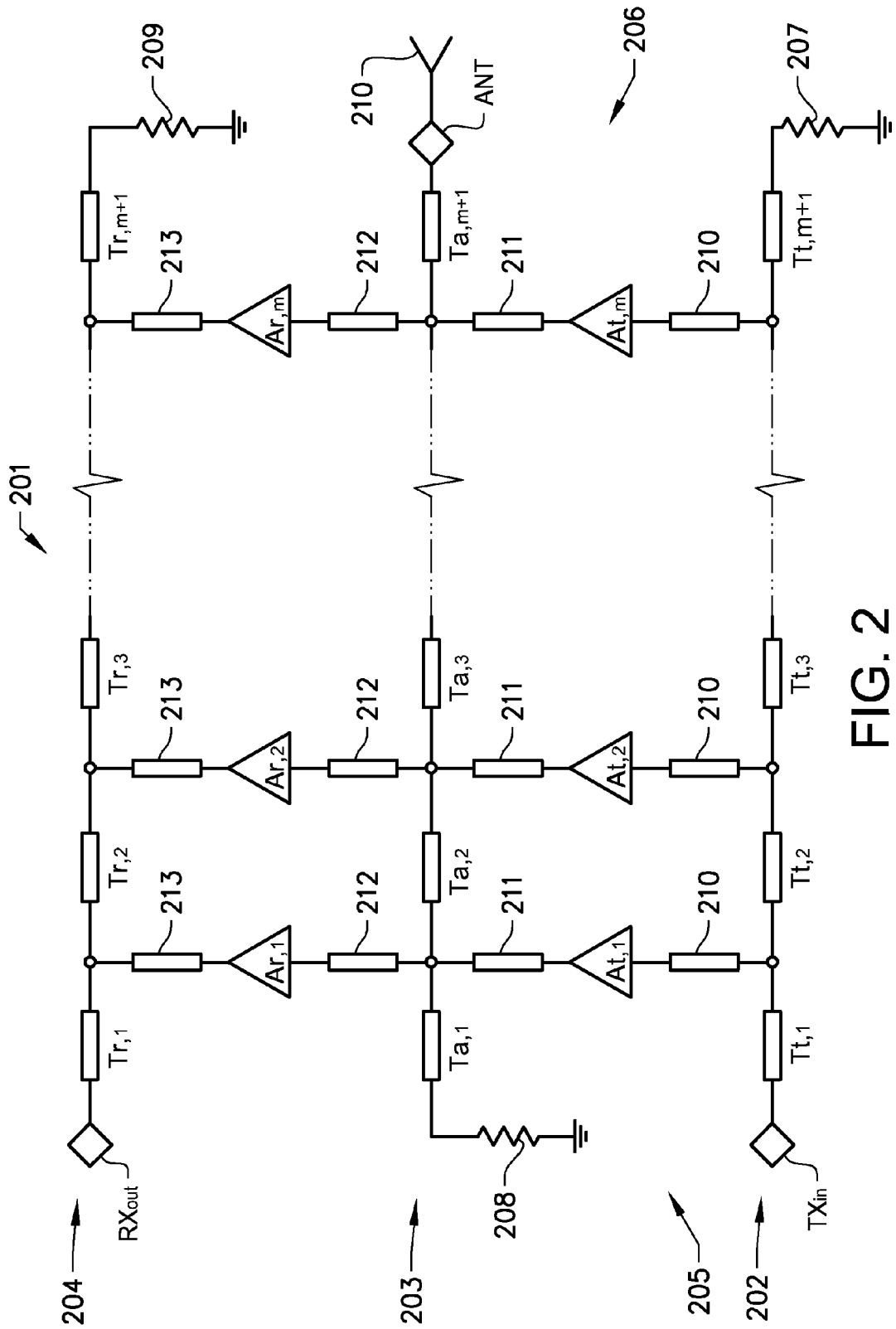
FIG. 2 schematically shows an example of an active circulator according to the invention.

The function of the active circulator illustrated in FIG. 5 otherwise corresponds to the functions of the active circulator of FIG. 2.

In one application of the invention the active circulator 201, 400, 500 comprises the front-end arrangement for each Transmit/Receive-module, T/R-module, in an Active Electronically Scanned Antenna, AESA, system.

The matching line sections and termination impedances shown in FIGS. 2, 4 and 5, and described in association with these figures, are all individual components and can assume individual values even if they are designated with equal reference signs in the figures.

The invention also includes a method to manufacture an active circulator for a microwave system. Said microwave system uses at least one front-end arrangement, each front-end arrangement having a power amplifier function arranged to deliver an amplified output signal via a circulator function to the antenna 210 in a transmit mode and a low noise amplifier function arranged to amplify an input signal from the antenna via the circulator function in a receive mode. The circulator function is arranged to direct a signal flow between the transmit and receive modes wherein the active circulator is manufactured as one module with the power amplifier function, the low noise amplifier function and the circulator function of directing a signal flow. Said three functions for one front-end arrangement are thus integrated into one module.

In one example of the method of the invention the power amplifier function and the low noise amplifier function are arranged as a Distributed Power Amplifier, DPA, and as a Distributed Low Noise Amplifier, DLNA, thus achieving a broad band performance. A distributed amplifier has at least two amplifiers, $A_{t,1}$ to $A_{t,m}$, $A_{r,1}$ to $A_{r,m}$, 300, connected in parallel between two transmission lines, 202-204, one transmission line having an input port to the distributed amplifier and the other transmission line having an output port of the distributed amplifier.

In one example of the method of the invention the active circulator 201, 400, 500 has an output transmission line 202, an antenna transmission line 203 and an input transmission line 204 in parallel, with the antenna transmission line located between the output and the input transmission lines. The transmission lines are extending between a first side 205 and a second side 206 of the active circulator and have following features:
- the output transmission line having a transmit input port TXin at the first side 205 and a first termination impedance 207 at the second side 206,
- the antenna transmission line 203 having a second termination impedance 208 at the first side 205 and an antenna port ANT at the second side 206 and
- the input transmission line 204 having a receive output port RXout at the first side 205 and a third termination impedance 209 at the second side 206.

The Distributed Power Amplifier, DPA, has at least two transmit amplifiers ($A_{t,1}$-$A_{t,m}$) connected in parallel between the output transmission line 202 and the antenna transmission line 203 and the Distributed Low Noise Amplifier, DLNA, having at least two receive amplifiers $A_{r,1}$ $A_{r,m}$ connected in parallel between the antenna transmission line 203 and the input transmission line 204.

In one example of the method of the invention the circulator function of directing a signal flow is arranged with the Distributed Low Noise Amplifier, DLNA, being turned off while the antenna is working in the transmit mode by applying a first control voltage to the Distributed Low Noise Amplifier, DLNA. The Distributed Power Amplifier, DPA is turned off while the antenna is working in the receive mode by applying a second control voltage to the Distributed Power Amplifier, DPA.

In one example of the method of the invention the active circulator is manufactured as a Monolithic Microwave Integrated Circuit, MMIC, module.

In one example of the method of the invention the MMIC module is manufactured using Gallium Nitride, GaN, semiconductor technology.

The invention is not limited to the examples and embodiments described above, but may vary freely within the scope of the appended claims.

The invention claimed is:

1. An active circulator for a microwave system, said microwave system comprising at least one front-end arrangement, each front-end arrangement comprising a power amplifier function arranged to deliver an amplified output signal via a circulator function to an antenna in a transmit mode, and a low noise amplifier function arranged to amplify an input signal from the antenna via the circulator function in a receive mode, the circulator function being arranged to direct a signal flow between the transmit and receive modes, wherein each front-end arrangement comprises one active circulator, said active circulator comprising:
   the power amplifier function, the low noise amplifier function and the circulator function for directing a signal flow, said three functions being integrated into one module, wherein the power amplifier function and the low noise amplifier function of the active circulator are arranged as a Distributed Power Amplifier, and as a Distributed Low Noise Amplifier, thus achieving a broad band performance, a distributed amplifier comprising at least two amplifiers connected in parallel between two transmission lines, one transmission line comprising an input port to the distributed amplifier and the other transmission line comprising an output port of the distributed amplifier;

an output transmission line;

an antenna transmission line; and an input transmission line arranged in parallel, with the antenna transmission line located between the output transmission line and the input transmission line, the transmission lines being arranged to extend between a first side and a second side of the active circulator, wherein the output transmission line comprises a transmit input port at the first side and a first termination impedance at the second side, wherein the antenna transmission line comprises a second termination impedance at the first side and an antenna port at the second side, wherein the input transmission line comprises a receive output port at the first side and a third termination impedance at the second side, wherein the Distributed Power Amplifier comprises at least two transmit amplifiers connected in parallel between the output transmission line and the antenna transmission line, and the Distributed Low Noise Amplifier comprises at least two receive amplifiers connected in parallel between the antenna transmission line and the input transmission line, and wherein at least one of the transmit or the receive amplifiers comprises at least two layers of sub amplifiers, wherein the sub amplifiers are arranged between two transmission lines where at least one is an intermediate transmission line.

2. The active circulator according to claim 1, wherein the active circulator comprises three ports:

an antenna port for connection to the antenna, this port being a common port for the output signal from the power amplifier function and for the input signal from the antenna, a transmit in port arranged to receive an input signal to the power amplifier function and a receive out port arranged to output a signal from the low noise amplifier function.

3. The active circulator according to claim 1, wherein the antenna transmission line is divided in two parallel transmission lines, a first and a second antenna transmission line, one end of the antenna transmission lines being connected to the antenna port at the second side of the active circulator and the opposite ends of the antenna transmission lines being connected to a reference plane via individual termination impedances or via one common termination impedance.

4. The active circulator according to claim 1, wherein the circulator function of directing a signal flow is arranged with the Distributed Low Noise Amplifier being arranged to be turned off while the antenna is working in the transmit mode by a first control voltage being arranged to be connected to the Distributed Low Noise Amplifier and the Distributed Power Amplifier is arranged to be turned off while the antenna is working in the receive mode by a second control voltage being arranged to be connected to the Distributed Power Amplifier.

5. The active circulator according to claim 1, wherein the active circulator is a Monolithic Microwave Integrated Circuit module.

6. The active circulator according to claim 5, wherein the monolithic microwave integrated circuit module is based on Gallium Nitride semiconductor technology.

7. The active circulator according to claim 1, wherein the active circulator comprises the front-end arrangement for each Transmit/Receive-module in an Active Electronically Scanned Antenna system.

8. A method to manufacture an active circulator for a microwave system, said microwave system using at least one front-end arrangement, each front-end arrangement having a power amplifier function arranged to deliver an amplified output signal via a circulator function to an antenna in a transmit mode and a low noise amplifier function arranged to amplify an input signal from the antenna via the circulator function in a receive mode, the circulator function being arranged to direct a signal flow between the transmit and receive modes, the method comprising:

manufacturing the active circulator as one module with the power amplifier function, the low noise amplifier function and the circulator function for directing a signal flow, said three functions for one front-end arrangement thus being integrated into one module, arranging the power amplifier function and the low noise amplifier function as a Distributed Power Amplifier and as a Distributed Low Noise Amplifier thus achieving a broad band performance, a distributed amplifier having at least two amplifiers connected in parallel between two transmission lines, one transmission line having an input port to the distributed amplifier and the other transmission line having an output port of the distributed amplifier, arranging an output transmission line, an antenna transmission line and an input transmission line in parallel, with the antenna transmission line located between the output and the input transmission lines, the transmission lines extending between a first side and a second side of the active circulator, providing the output transmission line with a transmit input port at the first side and a first termination impedance at the second side, providing the antenna transmission line with a second termination impedance at the first side and an antenna port at the second side, providing the input transmission line with a receive output port at the first side and a third termination impedance at the second side, providing the Distributed Power Amplifier with at least two transmit amplifiers, connected in parallel between the output transmission line and the antenna transmission line, and providing the Distributed Low Noise Amplifier with at least two receive amplifiers connected in parallel between the antenna transmission line and the input transmission line wherein at least one of the transmit or the receive amplifiers comprises at least two layers of sub amplifiers, wherein the sub amplifiers are arranged between two transmission lines where at least one is an intermediate transmission line.

9. The method according to claim 8, wherein the circulator function of directing a signal flow is arranged with the Distributed Low Noise Amplifier being turned off while the antenna is working in the transmit mode by applying a first control voltage to the Distributed Low Noise Amplifier and the Distributed Power Amplifier is turned off while the antenna is working in the receive mode by applying a second control voltage to the Distributed Power Amplifier.

10. The method according to claim 8, wherein the active circulator is manufactured as a Monolithic Microwave Integrated Circuit module.

11. The method according to claim 10, wherein the monolithic microwave integrated circuit module is manufactured using Gallium Nitride semiconductor technology.

* * * * *